(12) United States Patent
Lu et al.

(10) Patent No.: US 8,199,463 B2
(45) Date of Patent: Jun. 12, 2012

(54) OUTPUT ARCHITECTURE OF POWER SUPPLY

(75) Inventors: Shao-Feng Lu, Taoyuan Hsien (TW); Meng-Chieh Wu, Taoyuan Hsien (TW)

(73) Assignees: FSP Technology Inc., Taoyuan, Taoyuan Hsien (TW); 3Y Power Technology (Taiwan), Inc., Gueishan Shiang, Taoyuan Hsien (TW)

( * ) Notice: Subject to any disclaimer, the term of this patent is extended or adjusted under 35 U.S.C. 154(b) by 490 days.

(21) Appl. No.: 12/418,781

(22) Filed: Apr. 6, 2009

(65) Prior Publication Data

US 2010/0254097 A1   Oct. 7, 2010

(51) Int. Cl.
*H05K 7/14* (2006.01)
(52) U.S. Cl. ............... 361/601; 361/679.02; 361/724; 361/728
(58) Field of Classification Search ............ 361/601
See application file for complete search history.

(56) References Cited

U.S. PATENT DOCUMENTS

| | | | |
|---|---|---|---|
| 7,313,000 B2* | 12/2007 | Fiorentino et al. | 361/752 |
| 2005/0237724 A1* | 10/2005 | Fiorentino et al. | 361/752 |
| 2006/0262492 A1* | 11/2006 | Tsai | 361/601 |
| 2009/0161326 A1* | 6/2009 | Lin et al. | 361/752 |
| 2010/0115294 A1* | 5/2010 | Hsieh Chen | 713/300 |
| 2010/0177472 A1* | 7/2010 | Chang | 361/679.02 |

FOREIGN PATENT DOCUMENTS

TW        M308435        3/2007

* cited by examiner

*Primary Examiner* — Anthony Q Edwards
(74) *Attorney, Agent, or Firm* — Winston Hsu; Scott Margo

(57) ABSTRACT

An output architecture of a power supply is disclosed, wherein the power supply includes an input portion to obtain input power and a conversion circuit board connecting to the input portion to convert the input power into output power of different voltage potential. The conversion circuit board includes plural power output areas with different preset output voltages, and after selecting the output standard, the power output areas connect to at least one power extension board via plural electrical conductive elements, so as to provide the power extension board the output power, and the power extension board has plural output wires connected to a load. Through the architecture described above, the corresponding output wires can be selected after the output standard is selected for connecting to the power extension board, and then, the power extension board is connected to the conversion circuit board.

14 Claims, 10 Drawing Sheets

OUTPUT ARCHITECTURE OF POWER SUPPLY

FIELD OF THE INVENTION

The present invention is related to output architecture of a power supply, and more particularly to a power supply whose architecture facilitates the design of the output module thereof.

BACKGROUND OF THE INVENTION

It is well known that the power supply offers multiple output voltage potential. However, since the output power of the power supply becomes higher, under the same voltage potential, the current on the power line is also proportionally increased. The current increment causes the following problems. First, the consumption of the power line caused by the current may induce waste heat and may also influence the adjustment of insulation strength, and it is also a problem that if the power line could conduct the increased current. The waste heat can be reduced by improving the conductivity of the power line (reducing impedance) or increasing the heat-dispersing area of the power line. As to the insulation strength of the power line, it should be matched to the prescribed safety standard, and further, the current rating is also decided by the material or structure of the power line. Therefore, in the past, as designing the power supply with different output voltage standards, it always has to select a suitable power line conforming to the standards, especially when customizing the product where the output standard and corresponding product standard should meet the customer's requirement. However, in practice, it actually is very uneconomic to develop different product standards for every customer, and as mounting (or welding) the components on the PCB of the power supply, every time the output standard changes, the PCB layout also must be varied (because practically it is impossible to desolder the welded components and the new layout must be mounted on the new PCB). Therefore, time, labor and cost all are wasted.

Some disclosures had solved the above described problems, such as, R.O.C. patent No. M308435, entitled "An improvement of output structure for power supply". In this patent, an extended output structure of power supply is provided for extending out multiple power lines to conform to multiple peripherals connected to the power supply. Herein, the power lines in the power circuit (20) of the power supply are divided into motherboard power lines (31) and peripheral power lines (32), wherein the peripheral power lines (32) are connected to an I/O terminal of a circuit board (322). The I/O terminal of the circuit board (322) has 4 to 8 sockets for connecting wires, so that through the sockets on the circuit board, the peripheral power lines can be connected to each peripheral outside the case. However, the additional circuit board outside the power supply has fixed position and assembling fashion which actually might cause inconvenience, and for some customized power supplies, it also might be insufficient in space for further disposing the circuit board. Besides, because the motherboard power lines (31) and the peripheral power lines (32) are configured to "connect to the power circuit (20)", when the power circuit and the peripheral power lines do not conform to customer's requirement or the requirement changes, the structure can not be varied easily, so that the materials and the manpower are still wasted. Consequently, although this prior art improves the connection convenience between the power supplies and the peripherals, the variation in output standard and the convenience for replacing power lines are still unconsidered.

SUMMARY OF THE INVENTION

Therefore, in view of the inconvenience of replacing power lines and the consumption of cost and time, the object of the present invention is to provide architecture which can be easily varied based on different designs for power line replacement.

The present invention provides output architecture of a power supply, wherein the power supply includes an input portion to obtain an input power and a conversion circuit board connecting to the input portion to convert the input power into output power of different voltage potential. The conversion circuit board includes plural power output areas with different preset output voltages, and after selecting the output standard, the power output areas connect to at least one power extension board via plural electrical conductive elements, so as to provide the power extension board obtaining the output power, and the power extension board has plural output wires connected to the load. Through the architecture described above, the corresponding output wires can be selected to connect to the power extension board after the output standard is selected. And, through plural connection holes or connection elements mounted on the power output areas corresponding to the electrical conductive elements, the electrical conductive elements can electrically connect the power output areas to the power extension board, and further conduct the power to the output wires for supplying to the load.

Therefore, according to the present invention, as design changes, it can correspondingly change the selection of the power extension board and output wires without altering the configuration of the conversion circuit board, so that the design becomes easier, and the output wires also become replaceable.

BRIEF DESCRIPTION OF THE DRAWINGS

The foregoing aspects and many of the attendant advantages of this invention will be more readily appreciated as the same becomes better understood by reference to the following detailed description, when taken in conjunction with the accompanying drawings, wherein.

DESCRIPTION OF THE PREFERRED EMBODIMENT

Figure 1:
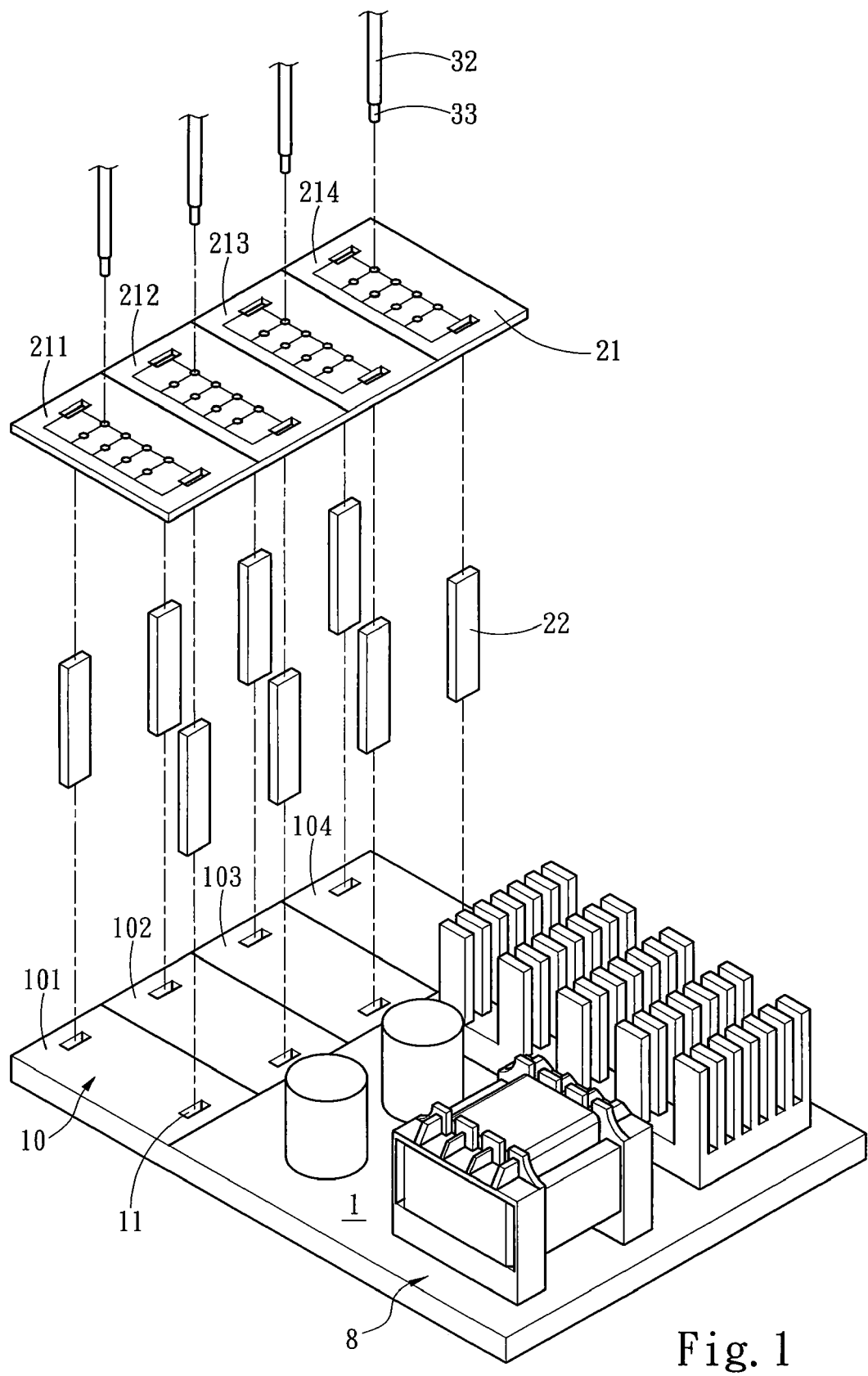
FIG. 1 is a schematic view showing the assembling of a first embodiment of the present invention.
Figure 2:
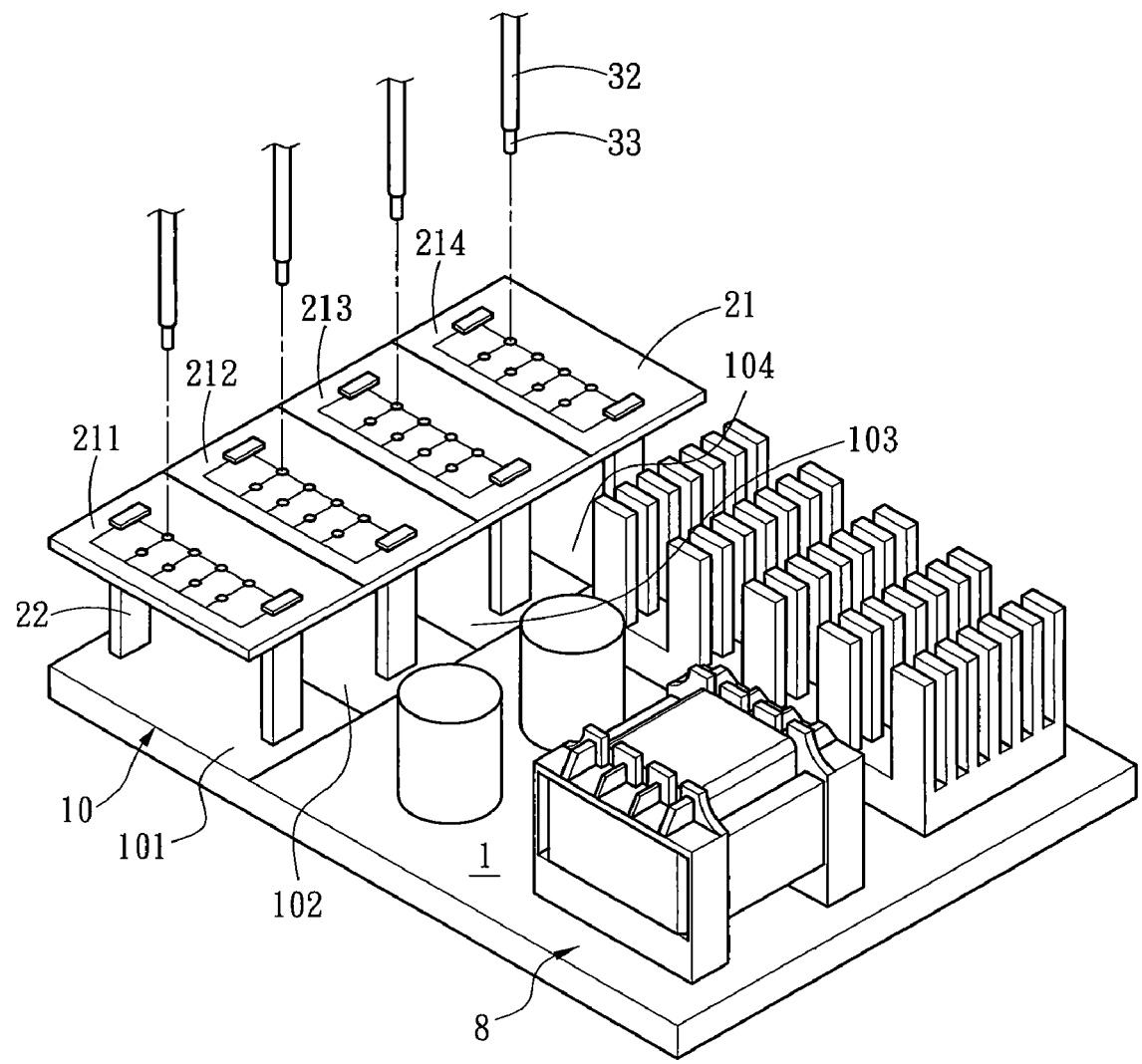
FIG. 2 is a three dimensional view of FIG. 1 after assembling.
Figure 5:
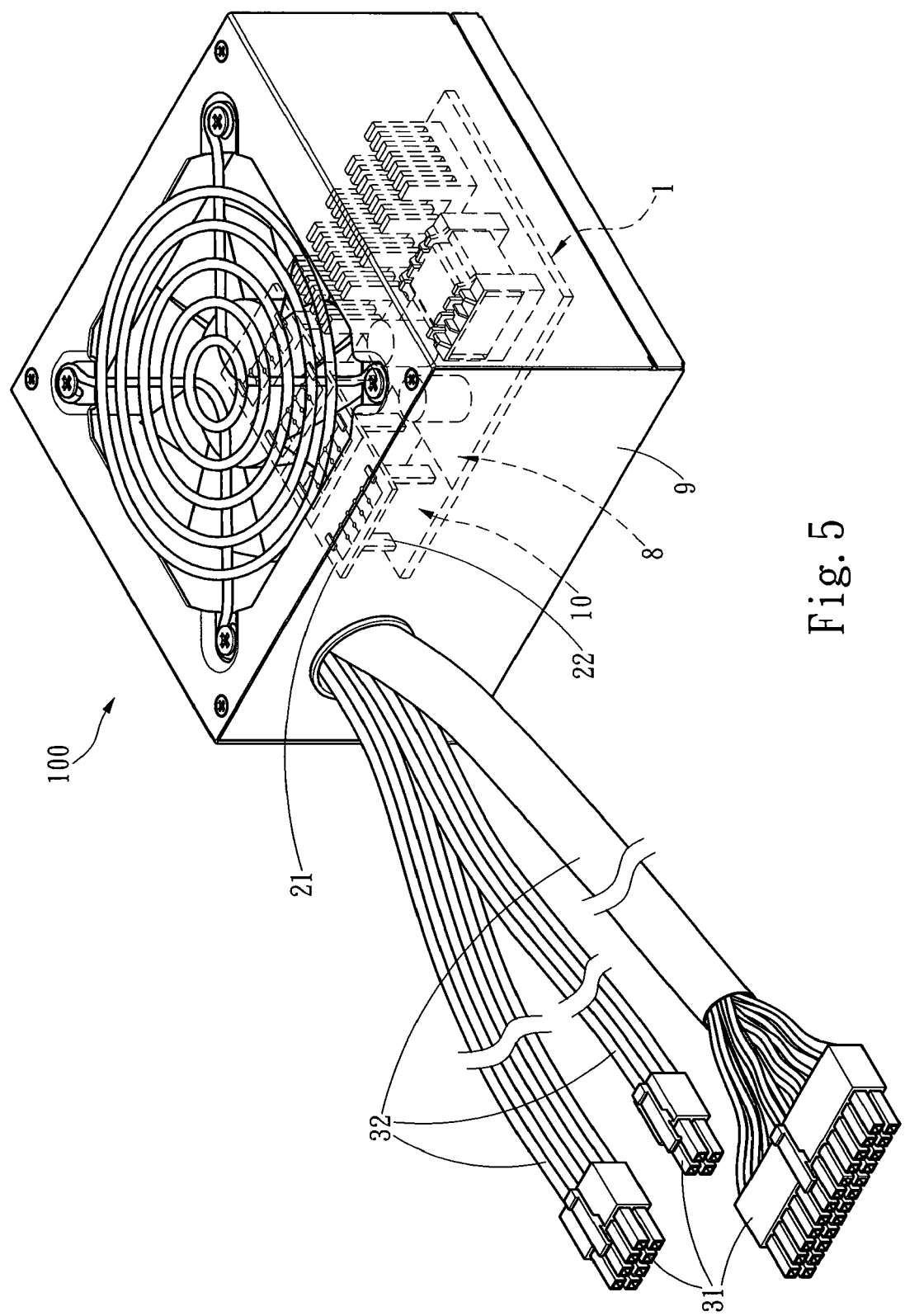
FIG. 5 is a schematic view showing the power supply in the first embodiment of the present invention.

The present invention provides output architecture of a power supply. FIG. 1 shows a first embodiment of the present invention. The power supply 100 (whose appearance is shown in FIG. 5) has an input portion (not shown in the drawings) connecting to a power source to obtain input power, and a conversion circuit board 1 (as shown in FIG. 2) connecting to the input portion to obtain the input power. The conversion circuit board 1 has a conversion circuit 8 for converting the input power into a DC output power, and the conversion circuit 8 includes at least one DC to DC converter for further shunting the output power into output power of at least one different potential, so that the power supply 100 can provide output power of at least two different voltage potential. Moreover, the conversion circuit board 1 includes at least one power output area 10 with preset output voltage which is a space reserved for providing output power. Furthermore, the present invention further includes at least one power extension board 21. When the rated output of voltage potential, current or the quantity and standard of output wires of the power supply 100 is decided, plural output wires 32 corresponding thereto will be connected to the power extension board 21, wherein the end of the output wire 32 connected to the power extension board 21 is an electrical connection terminal 33, and the connection can be achieved by welding or pre-digging plural small holes on the power extension board 21 for latchment. The power output area 10 is connected to the power extension board 21 through plural electrical conductive elements 22, so that the output power can be transmitted to the power extension board 21, wherein the electrical conductive elements 22 can be made of rigid conductive material (such as copper track). In this embodiment, the power output area 10 is implemented to have plural connection holes 11, which can be pre-dug thereon after deciding the rated output standard of the power supply 100, so as to insert plural electrical conductive elements 22 (as shown in FIG. 2), thereby further connecting with the power extension board 21. Here, the electrical conductive elements 22 can be welded or tightly engaged in the connection holes 11. Therefore, through the electrical conductive elements 22, the output power can be conducted from the power output area 10 to the power extension board 21, and further to the load via plural output wires 32.

Please further refer to FIG. 1 and FIG. 2. The power output area 10 can be divided into multiple small areas according to the voltage potential outputted from the conversion circuit 8. Take the embodiment shown in FIG. 1 and FIG. 2 as an example, the power output area 10 is divided into a first potential area 211 for providing 12V power, a second potential area 212 for providing 5V power, a third potential area 213 for providing 3.3V power, and a fourth potential area 214 for providing ground potential. Plural electrical conductive elements 22 are connected to at least two areas in the power output area 10 for conducting power of two different voltage potential to the power extension board 21. In this embodiment of FIG. 1 and FIG. 2, the electrical conductive elements 22 are respectively connected to the first, the second and the third potential areas 101, 102, 103, so that the electrical conductive elements 22 can conduct the output power of different voltage potential to the power extension board 21, and further, one or more electrical conductive elements 22 can be connected to the fourth potential area 104 for grounding. Through the conductive wires printed on the power extension board 21, the conductive wires are connected with the electrical conductive elements 22 and the output wires 32, The output wires 32 can be electrically connected with the electrical conductive elements 22 of corresponding voltage potential, wherein the output wires 32 will conduct at least two different output rated values, and the rated value of the output wire 32 can be preset output voltage potential, or can be the maximum current for the output wire 32. Therefore, the quantity and standard of the output wires 32 can be selected according to the output rated value, and the output wires 32 are connected to the power output area 10 through the power extension board 21 and the electrical conductive elements 22. Compared with the prior art, the output wires 32 of the present invention are connected to the power extension board 21 which can be assembled or disengaged freely, so that even the output standard is changed, through replacing the power extension board 21 and output wires 32 on the conversion circuit board 1 in the short time, the output standard can be changed easily and rapidly without altering the power output area 10.

Figure 3:
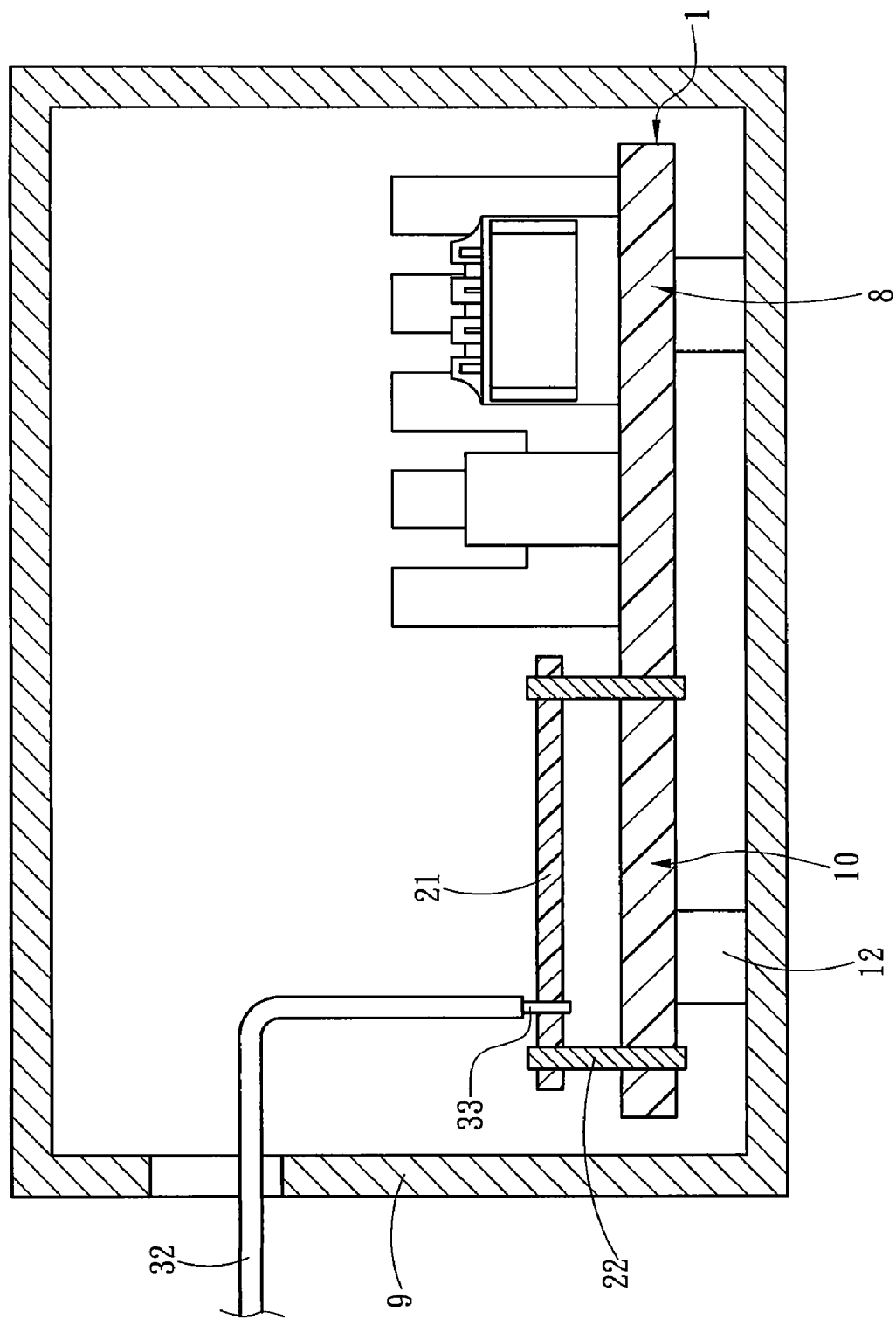
FIG. 3 is a sectional view of FIG. 1.
Figure 4:
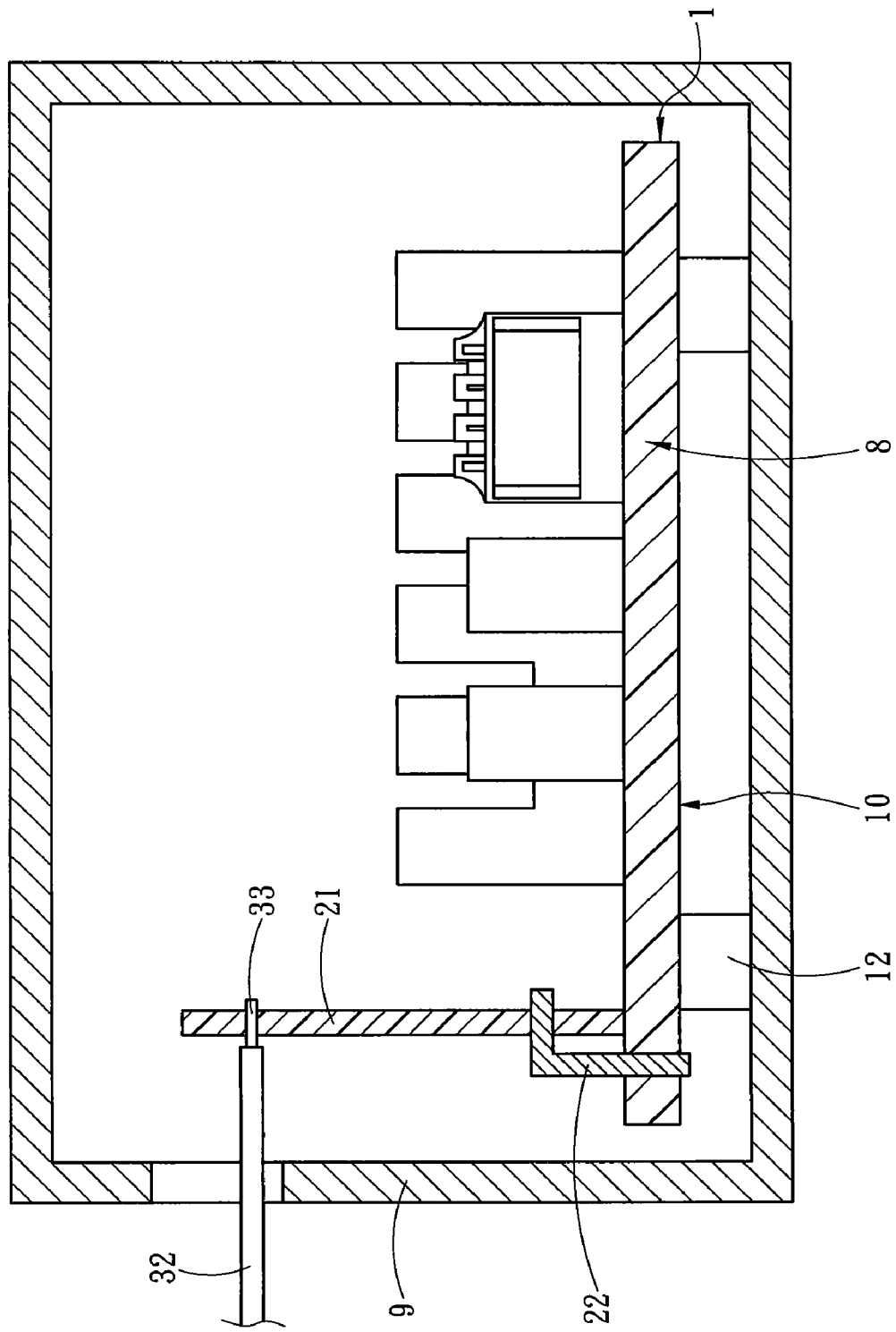
FIG. 4 is a schematic view showing another connection manner of the first embodiment of the present invention.

The positions of the conversion circuit board 1 and the power extension board 21 are shown in FIG. 3. As shown, the conversion circuit board 1 is fixed in a housing 9 through plural positioning elements 12 The conversion circuit board 1 has the conversion circuit 8 and the power output area 10 mounted thereon, and the power output area 10 is electrically connected to the power extension board 21 and the output wires 32 via the electrical conductive elements 22, thereby conducting the output power of at least two different voltage potential to the load, wherein the end of each output wire 32 connected to the power extension board 21 is implemented to be a connection terminal 31 for connecting to the load, and the connection terminals 31 of plural output wires 32 are implemented as at least two kinds of standards (as shown in FIG. 5). Furthermore, the electrical conductive elements 22 also can be implemented to have a bent angle so as to form an angle between the conversion circuit board 1 and the power extension board 21 (as shown in FIG. 4), thereby providing the flexibility of space disposition for the power supply 100 or the conversion circuit board 1, or the heat dispersing capability also can be improved by adjusting the position of the power extension board 21.

Figure 6:
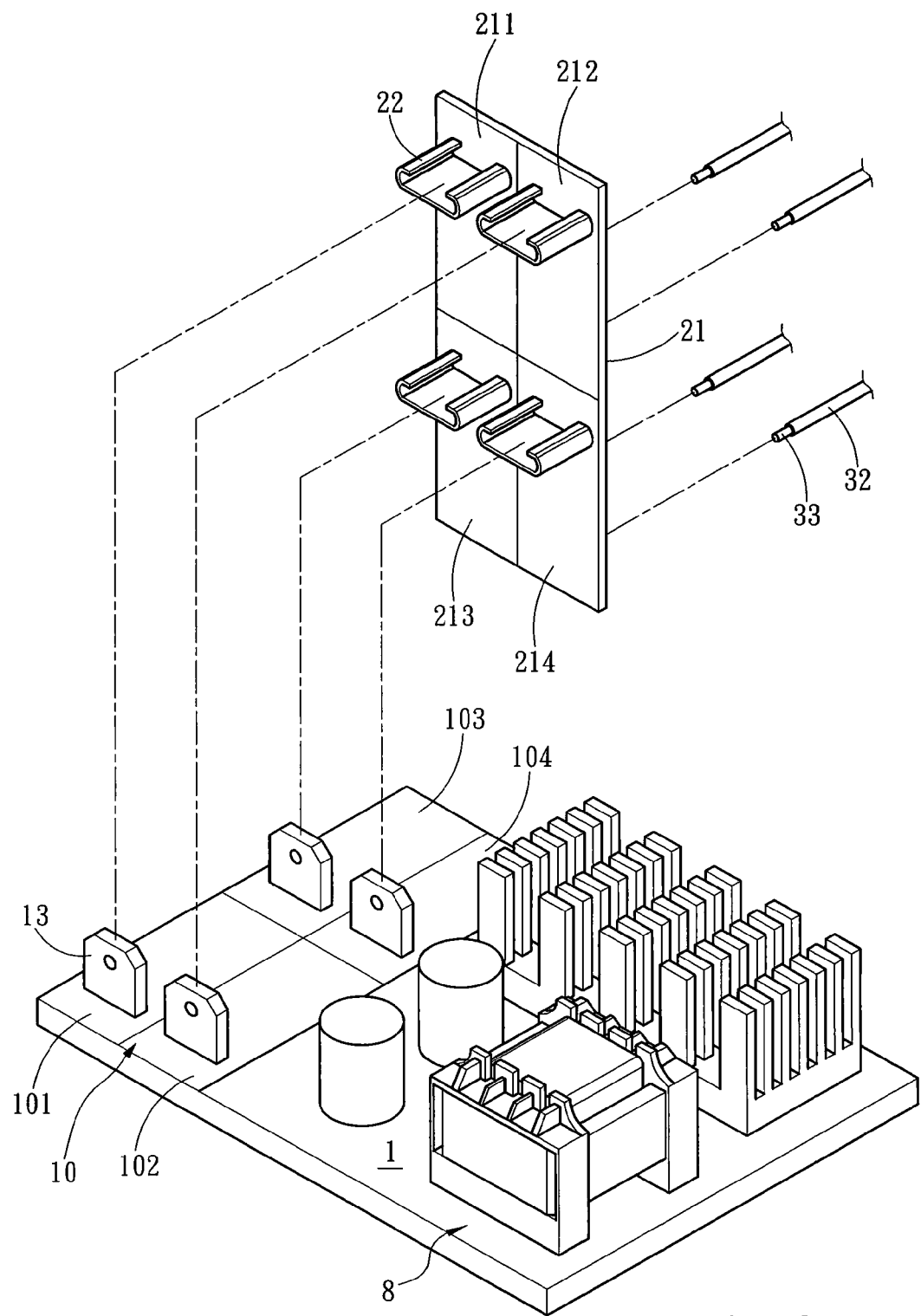
FIG. 6 is a schematic view showing the assembling of a preferred embodiment of the present invention.
Figure 7:
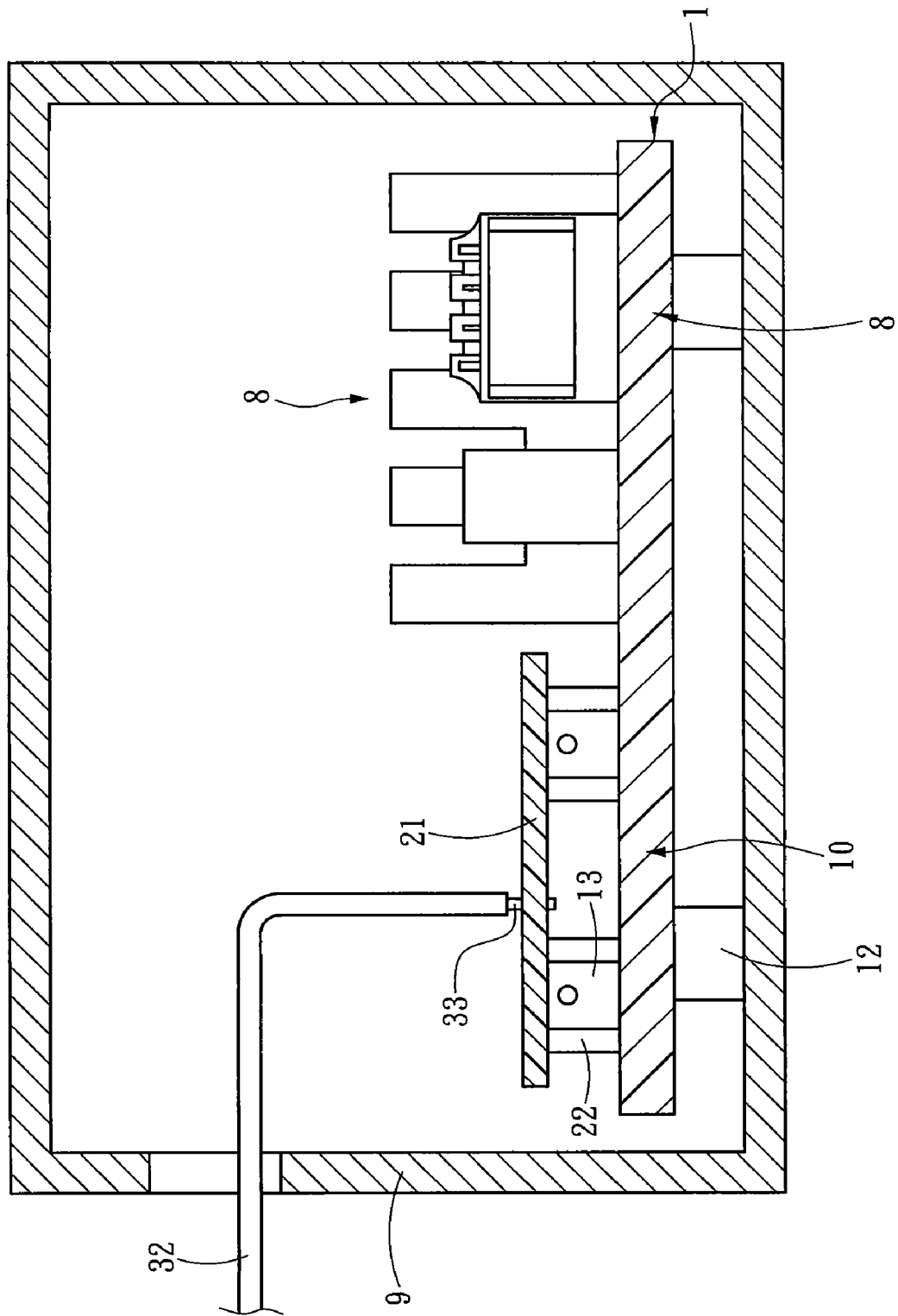
FIG. 7 is a sectional view of FIG. 6.
Figure 8:
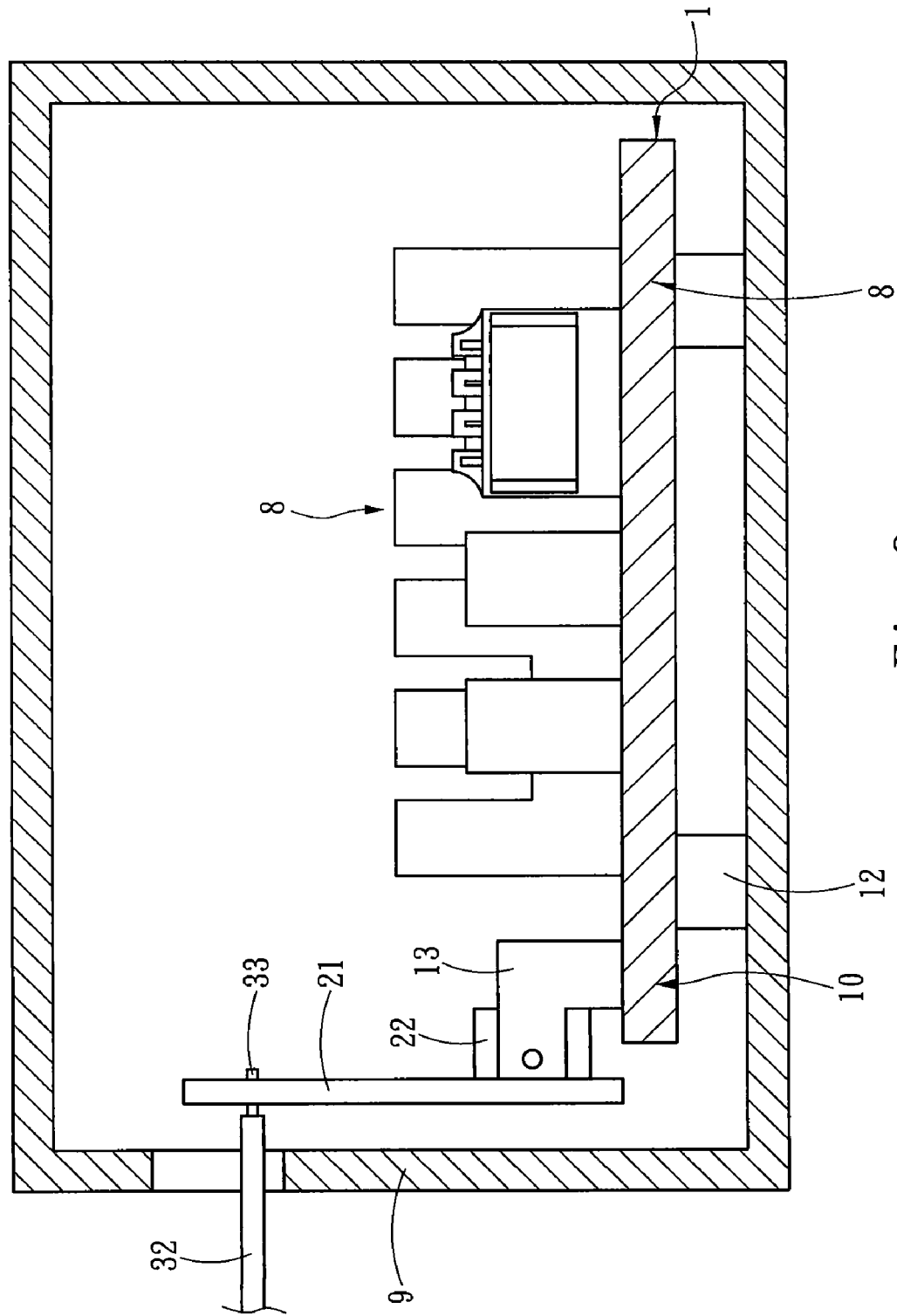
FIG. 8 is a schematic view showing another connection manner of the preferred embodiment of the present invention.
Figure 9:
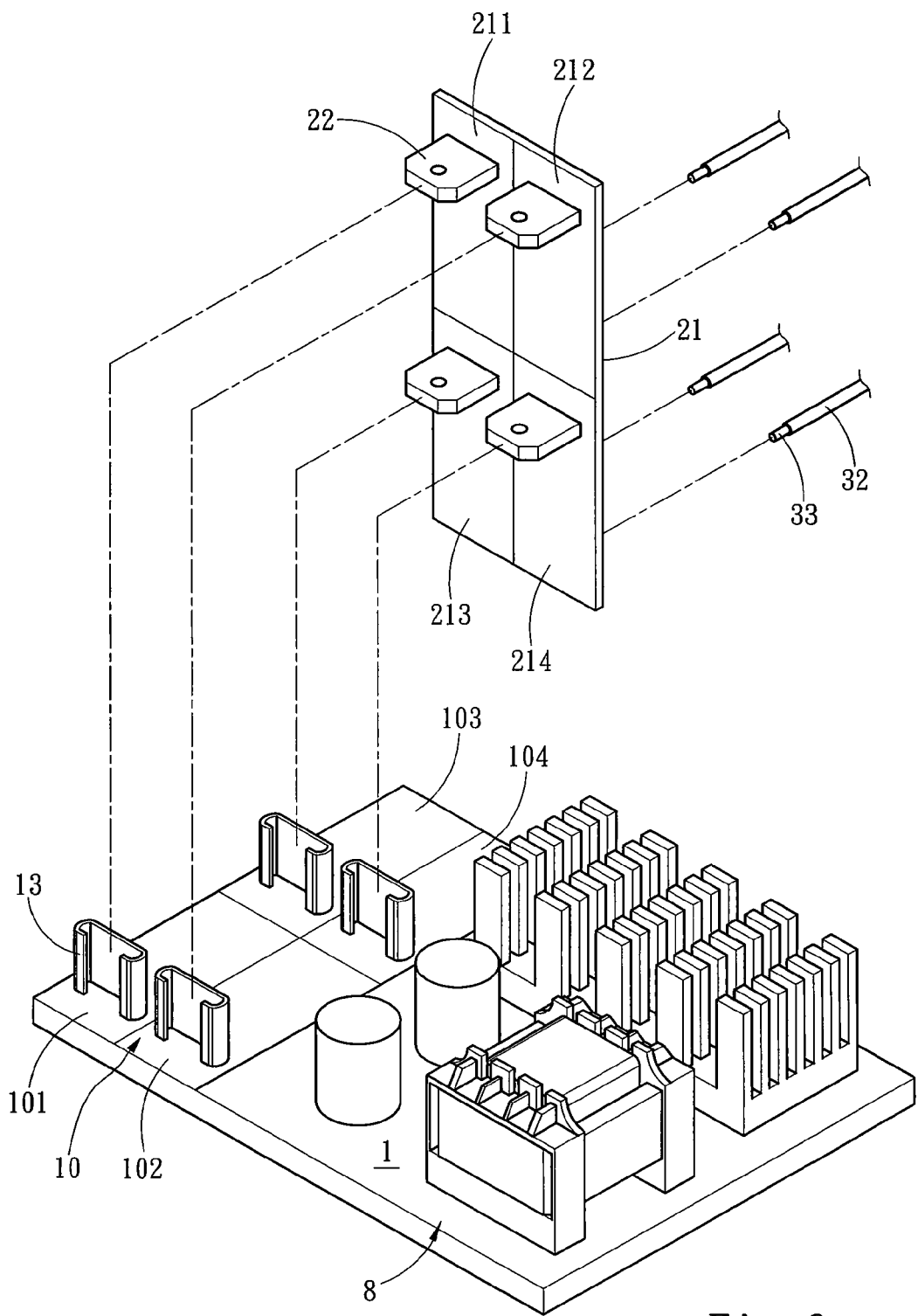
FIG. 9 is a schematic view showing the assembling of the connection elements and the electrical conductive elements in FIG. 8.
Figure 10:
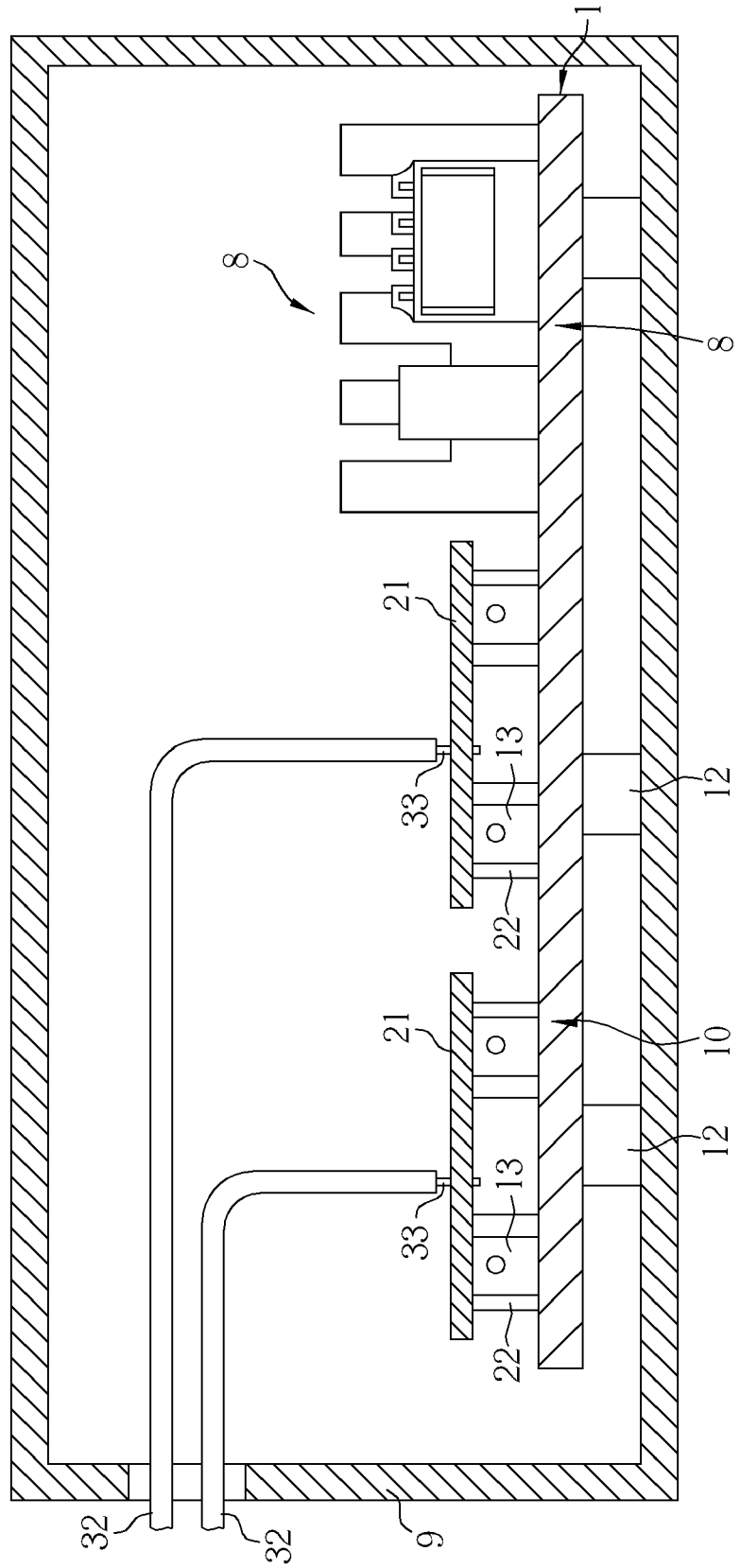
FIG. 10 is a sectional view of the power supply according to another exemplary embodiment of the present invention.

FIG. 6 and FIG. 7 show another preferred embodiment of the present invention, wherein the configuration of the power output area 10 is identical to the previous embodiment with first to fourth potential areas 101, 102, 103, 104. Correspondingly, the power extension board 21 is also implemented to have first to fourth output areas 211, 212, 213, 214. In this embodiment, the power output area 10 can have at least one connection element 13, and the power extension board 21 is preset to have at least one electrical conductive element 22 correspondingly connecting to the connection element 13. It should be noticed that the exemplary connection between the electrical conductive elements 22 and the connection elements 13 shown in FIG. 6 is only for illustration but not for limitation, and the positions thereof also can be exchanged (as shown in FIG. 9). The implementation of the electrical conductive element 22 and the connection element 13 provides more flexibility as selecting and connecting the power extension board 21, and also achieves easier insertion and selection of the prescribed output wires 32. Furthermore, the connection element 13 also can be implemented to have a bent angle so as to form an angle between the conversion circuit board 1 and the power extension board 21 (as shown in FIG. 8). Therefore, according to the present invention, as design changes, it can correspondingly change the selection of the power extension board 21 and output wires 32 without altering the configuration of the conversion circuit board 1, so that the design becomes easier, and the output wires 32 also become replaceable. The present invention is not limited to have only one power extension board 21 mounted on the conversion circuit board 1. The conversion circuit board 1 can be further connected to another independent power extension board 21 connecting to plural output wires 32 for providing output power of at least two different voltage potential as shown in FIG. 10.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A power supply system in a housing, the power supply system comprising:
    a power supply comprising:
        a first power extension board for providing an output power;
        an input portion for obtaining input power; and
        a conversion circuit board coupled to the input portion for converting the input power into output power of a different voltage potential;
    wherein the conversion circuit board comprises a plurality of power output areas with different preset output voltages, the plurality of power output areas are connected to the first power extension board via a plurality of electrical conductive elements, to provide the first power extension board with the output power, and the first power extension board has a plurality of output wires connected to a load.

2. The power supply system of claim 1, wherein the plurality of power output areas have a plurality of connection holes respectively corresponding to the plurality of electrical conductive elements.

3. The power supply system of claim 2, wherein the plurality of electrical conductive elements are connected to at least two power output areas of the plurality of power output areas, the two power output areas having different output voltages.

4. The power supply system of claim 3, wherein one of the electrical conductive elements is coupled to ground.

5. The power supply system of claim 3, wherein the first power extension board comprises:
    a plurality of conductive wires printed thereon for connecting each output wire of the plurality of output wires to each electrical conductive element of the plurality of electrical conductive elements having a corresponding voltage potential.

6. The power supply system of claim 1, wherein the plurality of power output areas have a plurality of connection elements mounted thereon for connecting to the plurality of electrical conductive elements, respectively.

7. The power supply system of claim 6, wherein each connection element is bent so as to form an angle between the conversion circuit board and the first power extension board.

8. The power supply system of claim 6, wherein the plurality of electrical conductive elements are connected to at least two power output areas with different output voltages.

9. The power supply system of claim 8, wherein one electrical conductive element of the plurality of electrical conductive elements is coupled to ground.

10. The power supply system of claim 8, wherein the first power extension board has a plurality of conductive wires printed thereon for coupling each output wire of the plurality of output wires to each electrical conductive element of the plurality of electrical conductive elements having a corresponding voltage potential.

11. The power supply system of claim 1, wherein the end of each output wire connected to the first power extension board is a connection terminal for connecting to the load, and the connection terminals of the plurality of output wires correspond to at least two kinds of standards.

12. The power supply of claim 1, wherein each electrical conductive element is bent so as to form an angle between the conversion circuit board and the first power extension board.

13. The power supply system of claim 1, further comprising:
    a second independent power extension board coupled to the conversion circuit board by means of the plurality of output wires for providing output power of at least two different voltage potentials.

14. The power supply system of claim 1, wherein the plurality of electrical conductive elements are made of rigid conductive material.

* * * * *